US009105340B2

(12) United States Patent
Lee et al.

(10) Patent No.: US 9,105,340 B2
(45) Date of Patent: *Aug. 11, 2015

(54) REDUCING SOURCE LOADING EFFECT IN SPIN TORQUE TRANSFER MAGNETORESISTIVE RANDOM ACCESS MEMORY (STT-MRAM)

(71) Applicant: QUALCOMM Incorporated, San Diego, CA (US)

(72) Inventors: Kangho Lee, San Diego, CA (US); Seung H. Kang, San Diego, CA (US); Xiachun Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/027,503

(22) Filed: Sep. 16, 2013

(65) Prior Publication Data

US 2014/0015077 A1 Jan. 16, 2014

Related U.S. Application Data

(62) Division of application No. 12/396,295, filed on Mar. 2, 2009, now Pat. No. 8,587,993.

(51) Int. Cl.
*G11C 11/00* (2006.01)
*G11C 11/16* (2006.01)
*H01L 43/02* (2006.01)

(52) U.S. Cl.
CPC ............... *G11C 11/16* (2013.01); *H01L 43/02* (2013.01)

(58) Field of Classification Search
CPC .... G11C 11/16; G11C 11/02; G11C 11/5607; G11C 11/15

USPC ............. 365/48, 50, 55, 66, 74, 97, 158, 171, 365/173, 209, 213, 225.5, 230.07, 232, 365/243.5

See application file for complete search history.

(56) References Cited

U.S. PATENT DOCUMENTS 6,683,815 B1 * 1/2004 Chen et al. ................. 365/225.5
6,765,823 B1 7/2004 Zhu et al.
(Continued)

FOREIGN PATENT DOCUMENTS

CN 1455463 A 11/2003
EP 1359590 11/2003
(Continued)

OTHER PUBLICATIONS

International Search Report and Written Opinion—PCT/US2010/025834, International Search Authority—European Patent Office—Sep. 30, 2010.

(Continued)

*Primary Examiner* — Tuan T Nguyen
*Assistant Examiner* — Khamdan Alrobaie
(74) *Attorney, Agent, or Firm* — Donald D. Min

(57) ABSTRACT

A memory cell comprises a magnetic tunnel junction (MTJ) structure that includes a free layer coupled to a bit line and a pinned layer. A magnetic moment of the free layer is substantially parallel to a magnetic moment of the pinned layer in a first state and substantially antiparallel to the magnetic moment of the pinned layer in a second state. The pinned layer has a physical dimension to produce an offset magnetic field corresponding to a first switching current of the MTJ structure to enable switching between the first state and the second state when a first voltage is applied from the bit line to a source line coupled to an access transistor and a second switching current to enable switching between the second state and the first state when the first voltage is applied from the source line to the bit line.

21 Claims, 10 Drawing Sheets

(56) References Cited

U.S. PATENT DOCUMENTS

| | | |
|---|---|---|
| 7,800,094 B2 | 9/2010 | Ho et al. |
| 2002/0067364 A1* | 6/2002 | Lane et al. .................... 345/531 |
| 2003/0123199 A1* | 7/2003 | Honda et al. .................. 360/324 |
| 2004/0145943 A1 | 7/2004 | Zhu et al. |
| 2004/0163072 A1 | 8/2004 | Levy |
| 2004/0217403 A1* | 11/2004 | Drewes ......................... 257/298 |
| 2005/0152179 A1 | 7/2005 | Katti |
| 2006/0053396 A1 | 3/2006 | Eng |
| 2006/0067116 A1 | 3/2006 | Hayakawa et al. |
| 2006/0198182 A1 | 9/2006 | Kim et al. |
| 2007/0242505 A1* | 10/2007 | Ochiai et al. .................. 365/171 |
| 2007/0285974 A1 | 12/2007 | Takemura et al. |
| 2008/0080233 A1 | 4/2008 | Hosotani et al. |
| 2008/0225581 A1 | 9/2008 | Yamane et al. |
| 2008/0247222 A1 | 10/2008 | Jung et al. |
| 2008/0273375 A1 | 11/2008 | Dahmani et al. |
| 2009/0027810 A1 | 1/2009 | Horng et al. |
| 2009/0067229 A1* | 3/2009 | Kang et al. .................... 365/163 |
| 2010/0220516 A1 | 9/2010 | Lee et al. |
| 2013/0161771 A1 | 6/2013 | Lee et al. |

FOREIGN PATENT DOCUMENTS

| | | |
|---|---|---|
| EP | 1918937 A1 | 5/2008 |
| JP | 2004087870 A | 3/2004 |
| JP | 2005109263 A | 4/2005 |
| JP | 2006190838 A | 7/2006 |
| JP | 2006295000 A | 10/2006 |
| JP | 2007294010 A | 11/2007 |
| JP | 2007311514 A | 11/2007 |
| JP | 2008091537 A | 4/2008 |
| JP | 2008117930 A | 5/2008 |
| JP | 2008227388 A | 9/2008 |
| JP | 2008310573 A | 12/2008 |
| JP | 2009081315 A | 4/2009 |
| JP | 2010177256 A | 8/2010 |
| JP | 2010212661 A | 9/2010 |
| WO | 2008109772 A1 | 9/2008 |
| WO | WO-2008125551 A1 | 10/2008 |

OTHER PUBLICATIONS

Jeong W C, et al., "Highly scalable MRAM using field assisted current induced switching" VLSI Technology, 2005. Digest of Technical Papers. 2005 Symposium on Kyoto, Japan Jun. 14-16, 2005, Piscataway, NJ, USA,IEEE, Piscataway, NJ, USA LNKDD0I: 10.1109/.2005. 1469260, Jun. 14, 2005, pp. 184-185, XP010818291 ISBN: 978-4-900784-00-0 the whole document.

Partial International Search Report—PCT/US2010/025834—International Search Authority, Eurpoean Patent Office, Jun. 26, 2010.

Vanhelmont et al., "Reduction of Ne'el coupling in magnetic tunnel junctions containing an artificial ferrimagnet in the free layer", Magnetics, IEEE Transactions on, vol. 40, No. 4, pp. 2293-2295, Jul. 2004.

Wang et al., "Magnetostatic coupling in spin dependent tunnel junctions", IEEE Transactions on, vol. 36, No. 5, pp. 2802-2805, Sep. 2000, DOI: 10.1 109/20.908594 URL: http://ieeexplore.ieee.org/stamp/stamp.jsp"tp=&arnumber=908594&isnumber=19613.

Taiwan Search Report—TW099106059—TIPO—Nov. 26, 2013.

\* cited by examiner

REDUCING SOURCE LOADING EFFECT IN SPIN TORQUE TRANSFER MAGNETORESISTIVE RANDOM ACCESS MEMORY (STT-MRAM)

I. CLAIM OF PRIORITY

The present application claims priority from and is a divisional of U.S. patent application Ser. No. 12/396,295, filed Mar. 2, 2009, entitled "REDUCING SOURCE LOADING EFFECT IN SPIN TORQUE TRANSFER MAGNETORESISITIVE RANDOM ACCESS MEMORY (STT-MRAM)," the content of which is incorporated by reference herein in its entirety.

II. FIELD OF THE DISCLOSURE

The present disclosure is generally directed to reducing a source loading effect in spin torque transfer magnetoresistive random access memory (STT-MRAM).

III. BACKGROUND

Advances in non-volatile memory technology include resistance-based memory technologies, such as Magnetoresistive Random Access Memory (MRAM). MRAM technology is an emerging non-volatile memory technology that employs ferromagnetic-based Magnetic Tunnel Junctions (MTJs) as the basic memory elements. A commonly used array architecture for MRAMs is the one-transistor, one-MTJ (1T1MTJ) architecture. As the name suggests, each bit cell in this architecture consists of an MTJ connected in series with an n-channel metal-oxide-semiconductor (NMOS) access transistor. In order to leverage the increased density and area reduction advantages associated with scaling down NMOS technologies, it is desirable to use smaller transistors and lower operating voltages for the MRAM bit cell. However, while scaling down NMOS technology into the deep submicron regime yields area and density benefits, difficulties may arise in designing an 1T1MTJ architecture with stable operation, particularly with respect to a source loading effect.

IV. SUMMARY

In a particular embodiment, a method is disclosed that includes determining a switching current ratio of a magnetic tunnel junction (MTJ) structure that enables stable operation of a memory cell. The memory cell includes the MTJ structure coupled to an access transistor. The method also includes modifying an offset magnetic field that is incident to a free layer of the MTJ structure. The modified offset magnetic field causes the MTJ structure to exhibit the switching current ratio. The offset magnetic field may result from magnetostatic couplings between the free layer and its adjacent layers in the MTJ structure.

A polarity of the offset field may depend on a connection type. In a particular embodiment, the memory cell may be adjusted from a first configuration having the access transistor electrically coupled to a pinned layer of the MTJ structure to a second configuration having the access transistor electrically coupled to the free layer of the MTJ structure to reduce a source loading effect at the memory cell. In one embodiment, a memory cell having the adjusted thickness of the pinned layer of the MTJ structure is disclosed. In another embodiment, an apparatus including a spin torque transfer magnetoresistive random access memory (STT-MRAM) is disclosed that includes a memory cell that is designed in accordance with the disclosed method.

In another embodiment, an apparatus is disclosed that includes a memory cell that includes a magnetic tunnel junction (MTJ) structure. The MTJ structure includes a free layer coupled to a bit line and also includes a pinned layer. A magnetic moment of the free layer is substantially parallel to a magnetic moment of the pinned layer in a first state and substantially antiparallel to the magnetic moment of the pinned layer in a second state. The pinned layer has a physical dimension to produce an offset magnetic field corresponding to a first switching current of the MTJ structure to enable switching between the first state and the second state when a first voltage is applied from the bit line to a source line coupled to an access transistor and a second switching current to enable switching between the second state and the first state when the first voltage is applied from the source line to the bit line.

In another embodiment, a memory cell is disclosed that includes a magnetic tunnel junction (MTJ) structure. The MTJ structure includes a free layer and also includes a pinned layer coupled to a bit line. A magnetic moment of the free layer is substantially parallel to a magnetic moment of the pinned layer in a first state and substantially antiparallel to the magnetic moment of the pinned layer in a second state. The memory cell also includes an access transistor having a source terminal coupled to a source line and having a drain terminal coupled to the free layer of the MTJ structure via a conductive path. A first distance between the free layer and the drain terminal of the access transistor is greater than a second distance between the pinned layer and the drain terminal.

In another embodiment, an apparatus is disclosed that includes a memory device that includes a plurality of memory cells. At least one memory cell of the plurality of memory cells includes a magnetic tunnel junction (MTJ) structure. A magnetic moment of a free layer of the MTJ structure is substantially parallel to a magnetic moment of a pinned layer of the MTJ structure in a first state and substantially antiparallel to the magnetic moment of the pinned layer in a second state. The memory cell also includes an access transistor coupled to the MTJ structure. A ratio of a magnitude of a first switching current to switch the MTJ structure from the first state to the second state is less than half of a second switching current to switch the MTJ structure from the second state to the first state.

One particular advantage provided by the disclosed embodiments is a design methodology for the different bitcell types to achieve STT-MRAM switching by adjusting device parameters to operate within a particular transistor current-voltage characteristic.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

Figure 9:
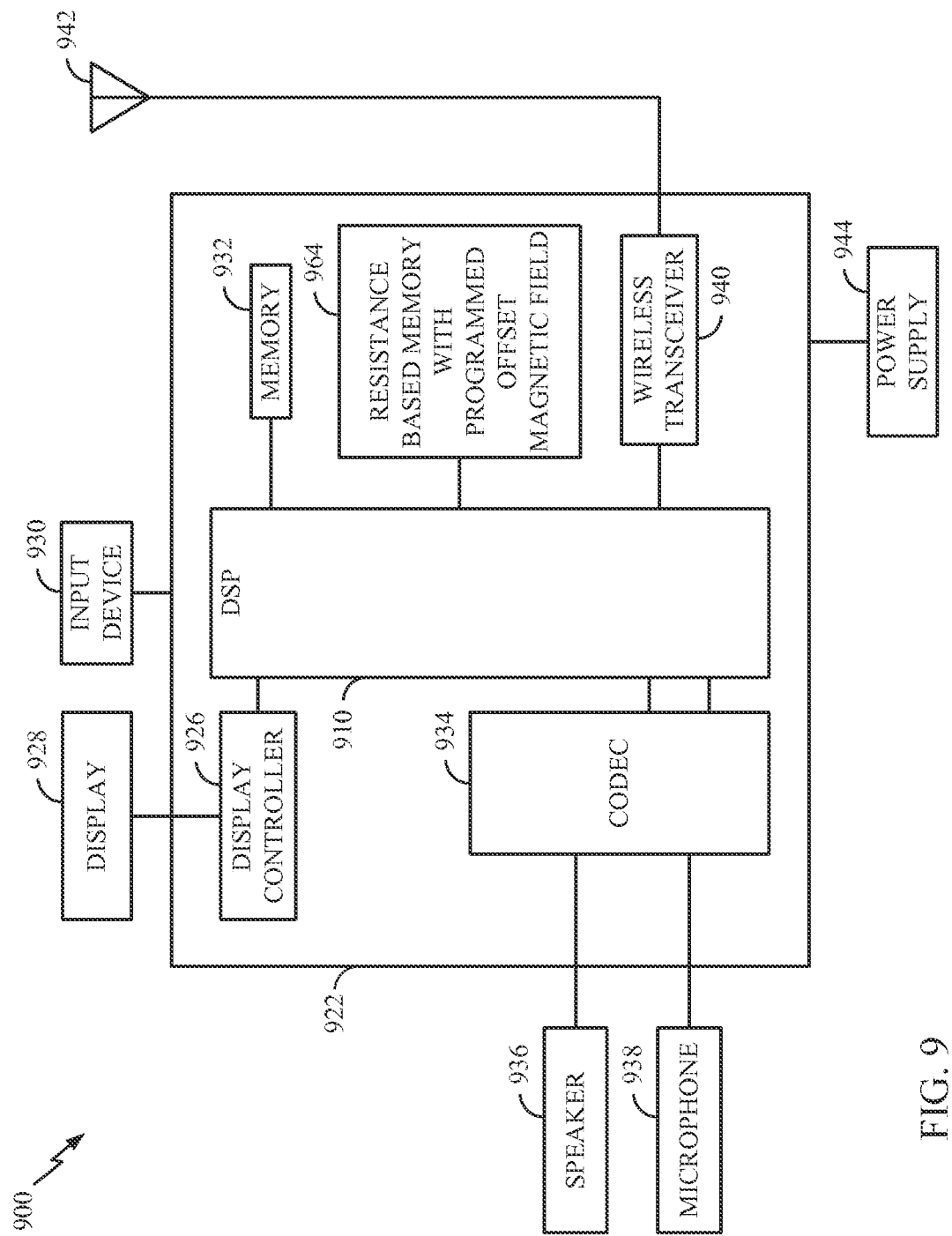
Figure 10:
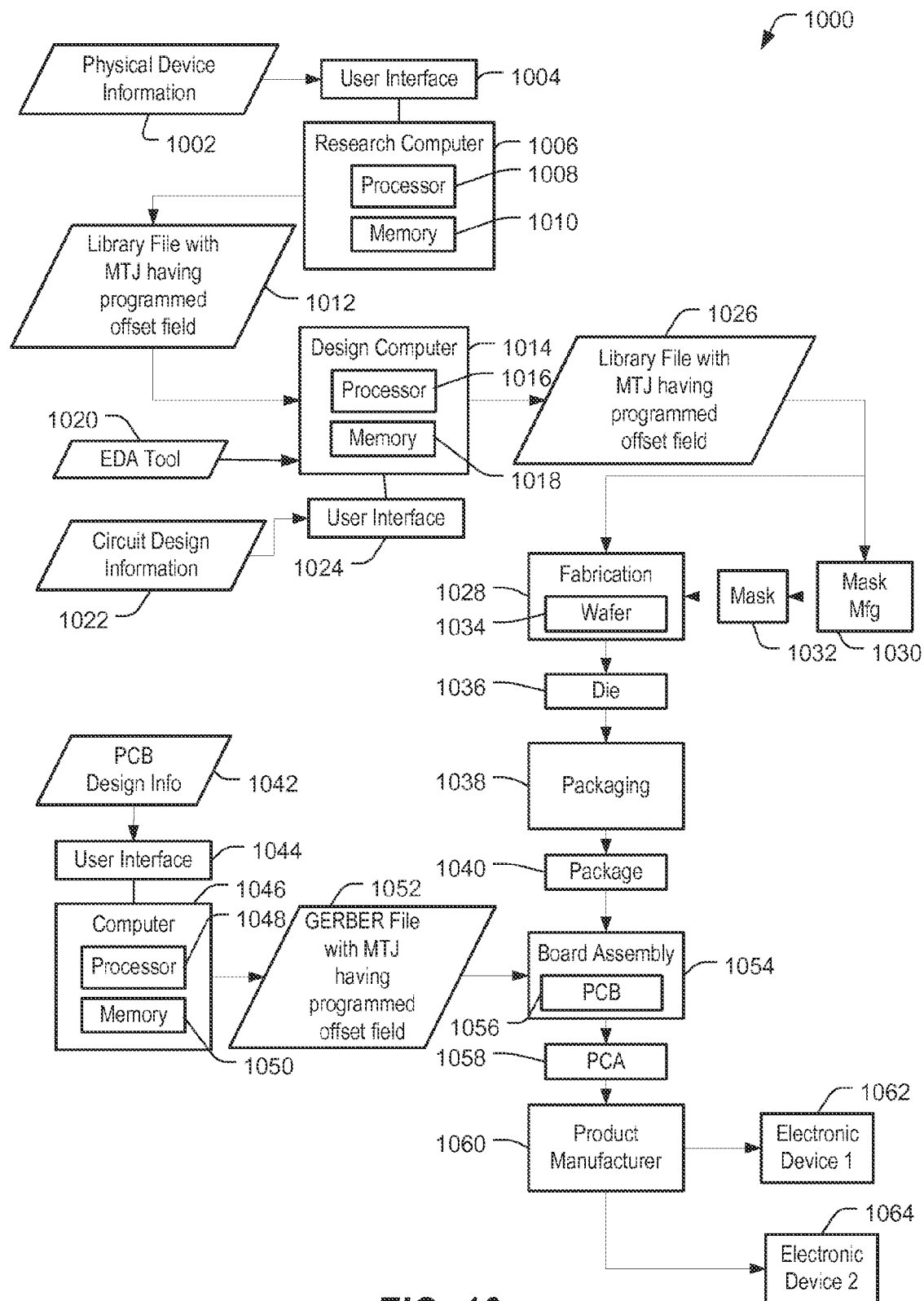

FIG. 9 is a block diagram of a particular illustrative embodiment of a wireless communication device including a resistance based memory having a memory cell with a programmed offset magnetic field; and FIG. 10 is a data flow diagram of a particular illustrative embodiment of a manufacturing process to manufacture electronic devices that include a memory cell having a programmed offset magnetic field.

VI. DETAILED DESCRIPTION

Figure 1:
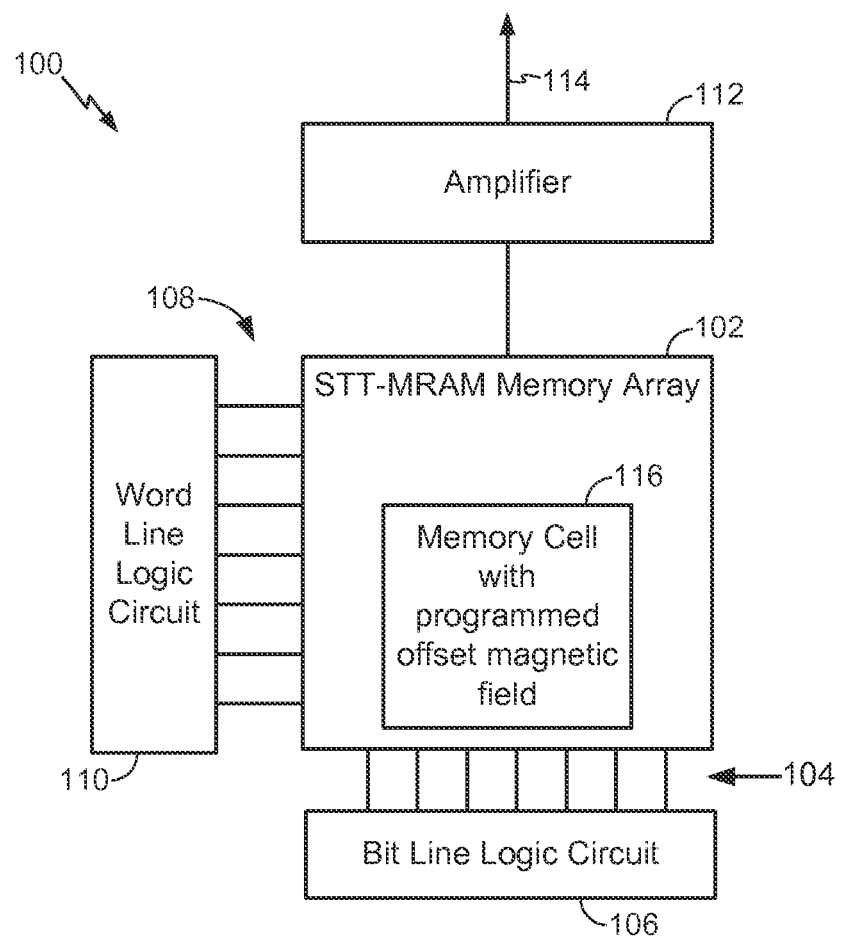
FIG. 1 is a block diagram of a particular illustrative embodiment of a memory device including a memory cell having a programmed offset magnetic field.

Referring to FIG. 1, a diagram of a particular illustrative embodiment of a memory device including a memory cell having a programmed offset magnetic field is depicted and generally designated 100. The memory device 100 may include a memory array 102, such as spin torque transfer magnetoresistive random access memory (STT-MRAM) memory array. The memory array 102 includes a memory cell 116 having a programmed offset magnetic field. The memory array 102 may be coupled by bit lines 104 to a bit line logic circuit 106. The memory array 102 may be coupled by word lines 108 to a word line logic circuit 110. The memory array 102 may also be coupled to an amplifier 112.

In a particular embodiment, the memory cell 116 having the programmed offset magnetic field includes a magnetic tunnel junction (MTJ) structure coupled to an access transistor in a 1T1MTJ configuration. As will be discussed with respect to FIGS. 2-8, the memory cell 116 may have one or more physical dimensions selected to program an offset magnetic field of the MTJ structure. The offset magnetic field is programmed to shift critical switching points of the MTJ to enable writing data values to the memory cell 116 when the access transistor is in a source loading operating state.

Figure 2:
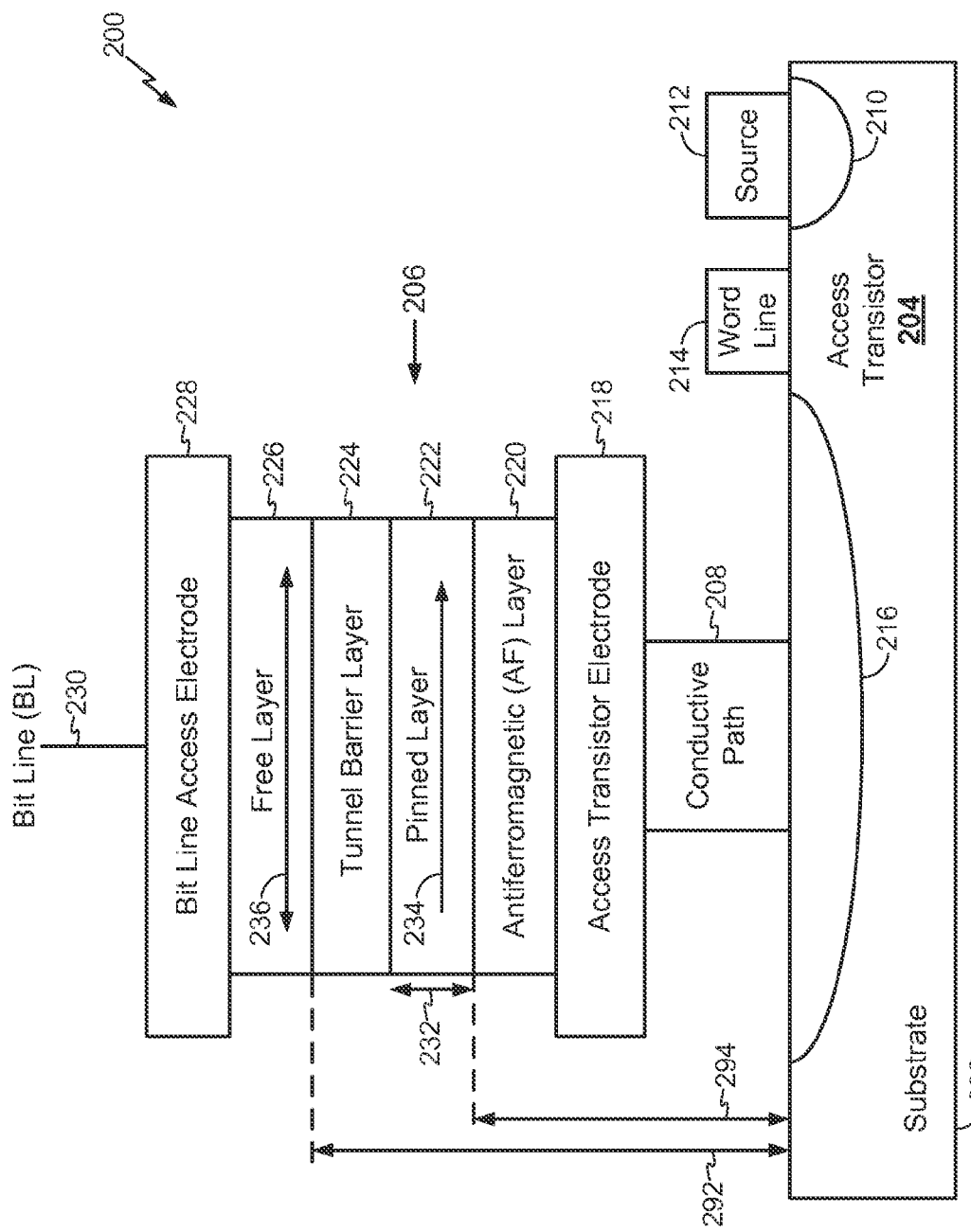
FIG. 2 is a diagram of a particular illustrative embodiment of a memory cell having a programmed offset magnetic field.

FIG. 2 is a diagram of a particular illustrative embodiment of a memory cell having a programmed offset magnetic field. The memory cell 200 includes a substrate 202 having an access transistor 204 coupled to a MTJ structure 206 via a conductive path 208, such as one or more metal or polysilicon wires, contacts, or vias. In a particular embodiment, the memory cell 200 is the memory cell 116 of FIG. 1.

The access transistor 204 has a source 210 coupled to a source contact 212 that is coupled to a source line and a drain 216 coupled to the MTJ structure 206 via the conductive path 208. A voltage applied to a word line 214 modulates a channel between the source 210 and the drain 216.

The MTJ structure 206 includes an access transistor electrode 218 connected to the conductive path 208. The MTJ structure 206 includes an antiferromagnetic (AF) layer 220 on the access transistor electrode 218, a pinned layer 222, a tunnel barrier 224, and a free layer 226. A bit line access electrode 228 is coupled to a bit line (BL) 230. The free layer 226 is a first distance 292 from the drain 216, and the pinned layer 222 is a second distance 294 from the drain 216. The second distance 294 is less than the first distance 292.

The pinned layer 222 includes a pinned magnetic moment 234 having a direction that is fixed by the AF layer 220. The free layer 226 includes a magnetic moment 236 that can have a parallel or antiparallel orientation with respect to the pinned magnetic moment 234. In a first state, the magnetic moment 236 of the free layer 226 is substantially parallel to the pinned magnetic moment 234 of the pinned layer 222 (the "P" state). In a second state, the magnetic moment 236 of the free layer 226 is substantially anti-parallel to the pinned magnetic moment 234 of the pinned layer 222 (the "AP" state). A first current density, termed a "critical" current density $J_{C(P \rightarrow AP)}$, represents a lowest current density that causes the MTJ structure 206 to switch from the first state to the second state ("P→AP"). A second "critical" current density $J_{C(AP \rightarrow P)}$ represents a lowest current density that causes the MTJ structure 206 to switch from the second state to the first state ("AP→P"). Generally, P→AP switching requires a greater current than AP→P switching, i.e. $J_{C(AP \rightarrow P)} < J_{C(P \rightarrow AP)}$. In addition, the asymmetry of the critical current densities tends to increase as the tunneling magnetoresistance (TMR) increases.

In a particular embodiment, the pinned layer 222 has a physical dimension 232 such as a thickness that is selected to program an offset magnetic field of the free layer 226, as will be discussed with respect to FIGS. 3-8. The offset magnetic field affects the first and second critical current densities such that switching currents between the two states can be set to ensure stable operation of the memory cell 200.

Although the pinned layer 222 is illustrated as a single layer, the pinned layer 222 may include a synthetic layer having multiple layers. Also, in other embodiments the MTJ structure 206 includes additional layers not illustrated in FIG. 2.

Figure 3:
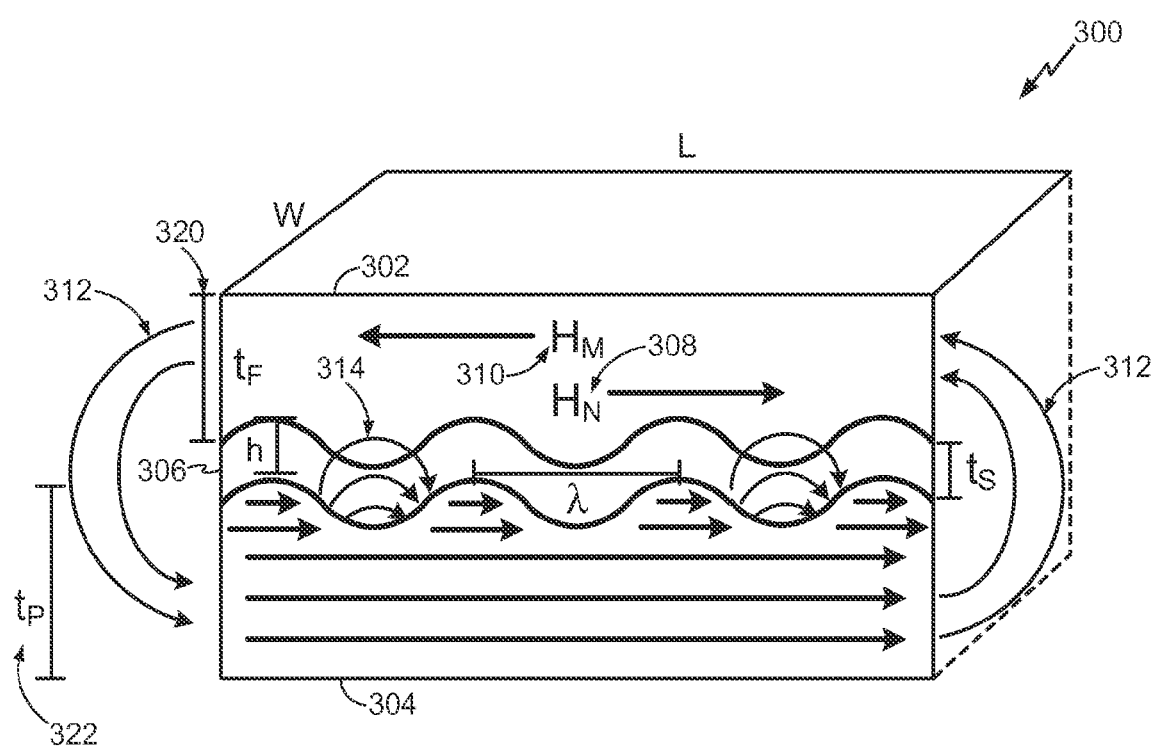
FIG. 3 is a diagram of a first illustrative embodiment of a magnetic tunnel junction (MTJ) structure having a programmed offset magnetic field.

FIG. 3 is a diagram of a first illustrative embodiment of a magnetic tunnel junction (MTJ) structure having a programmed offset magnetic field. The MTJ structure 300 includes a free layer 302 coupled to a pinned layer 304 via a barrier layer 306. In a particular embodiment, the free layer 302, the barrier layer 306, and the pinned layer 304 are the free layer 226, the tunnel barrier layer 224, and the pinned layer 222, respectively, of FIG. 2.

The free layer 302 is magnetically coupled to the pinned layer 304 via an offset field including a Neel coupling component $H_N$ 308 and a magnetostatic coupling $H_M$ 310. The Neel coupling component $H_N$ 308 is due to interface roughness and is illustrated by field lines 314. The magnetostatic coupling $H_M$ 310 is due to uncompensated poles near the edges of the structure and is illustrated by field lines 312. The resultant offset field $H_{OFF}$ can be approximated as:

$$H_{OFF} = H_N + H_M$$

$$H_M = B/L, \text{ and}$$

$$H_N = \frac{\pi^2}{\sqrt{2}}\left(\frac{h^2}{\lambda t_F}\right) M_s \exp\left(\frac{-2\pi\sqrt{2}\, t_S}{\lambda}\right)$$

where B is a magnetic flux that is proportional to a thickness $t_P$ 322 of the pinned layer 304, and L is a length of the pinned layer 304 in the field direction.

The Neel coupling field can be negligible and may be pre-determined by a quality of the tunneling insulator deposition process. Hence, in this particular structure, the offset field can be controlled by adjusting the thickness $t_P$ 322 of the pinned layer 304.

Figure 4:
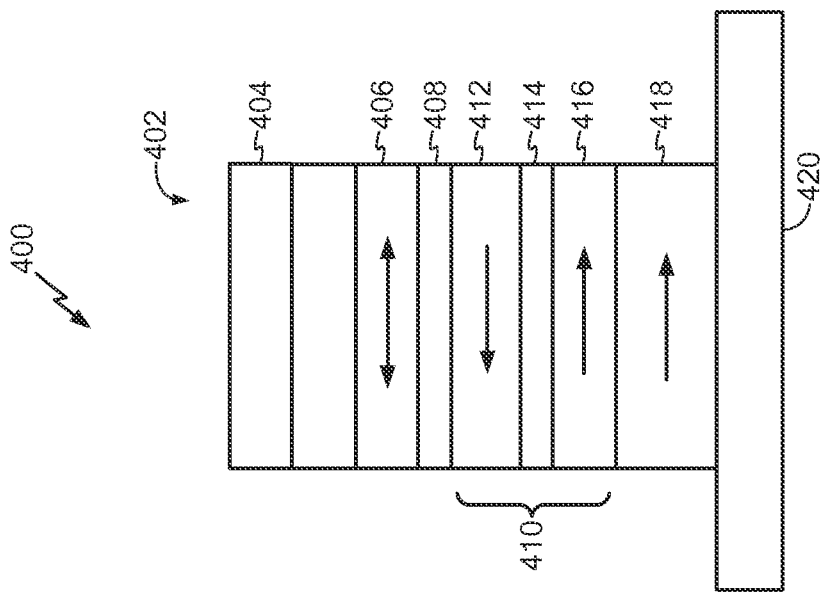
FIG. 4 is a diagram of a second illustrative embodiment of a magnetic tunnel junction (MTJ) structure having a programmed offset magnetic field.
Figure 4:
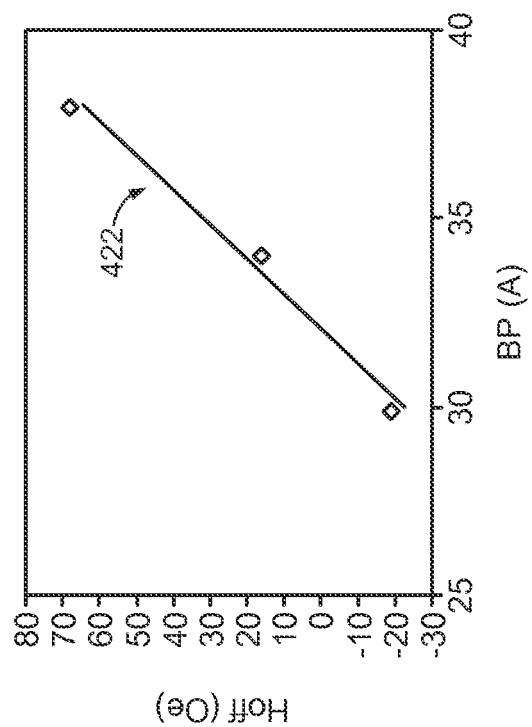

FIG. 4 is a diagram of a second illustrative embodiment 400 of a magnetic tunnel junction (MTJ) structure having a programmed offset magnetic field. The MTJ structure 402 includes a top electrode 404, a free layer 406, a barrier layer 408, a pinned layer 410, and an antiferromagnetic layer 418 on a bottom electrode 420. The pinned layer 410 is a synthetic layer that includes a first magnetic layer 412 that is proximate to the free layer 406, a non-magnetic layer 414, and a second magnetic layer 416. The first magnetic layer 412 has a first magnetic moment and the second magnetic layer 416 has a second magnetic moment that is antiparallel to the first magnetic moment of the first magnetic layer 412.

A model 422 of an offset field $H_{off}$ at the free layer 406 is illustrated as a function of a thickness of the second magnetic layer 416. The model 422 is illustrated as generally linear, and may empirically generated, theoretically generated, or any combination thereof. As illustrated, decreasing a thickness of the second magnetic layer 416 applies a negative shift to the offset magnetic field, while increasing a thickness of the second magnetic layer 416 applies a positive shift to the offset magnetic field. In addition, the offset magnetic field may change direction, indicated as a transition from negative offset field values to positive offset field values with increasing thickness of the second magnetic layer 416.

For example, when the second magnetic layer 416 is sufficiently thin, the first magnetic layer 412 may generate a larger component of the offset field to the free layer 406. As the thickness of the second magnetic layer 416 is increased relative to the first magnetic layer, the second magnetic layer 416 contributes an increasing portion of the offset field in a direction opposite to that of the first magnetic layer 412, and eventually contributing a larger component of the offset field, resulting in a change of direction of the offset field. Such behavior is illustrated as the offset field reducing in magnitude to zero, then changing signs and increasing in magnitude, with increasing thickness.

Although the MTJ structure 402 and the corresponding model 422 are based on a single pinned layer 410 having two magnetic layers 412 and 416, in other embodiments the MTJ structure 402 may have any number of layers, the thickness of any of which may be adjusted to set the offset field. Models enabling such adjustments to the various thicknesses to specifically select or shift an offset field magnitude and direction may be generated theoretically or experimentally, or any combination thereof.

Figure 5:
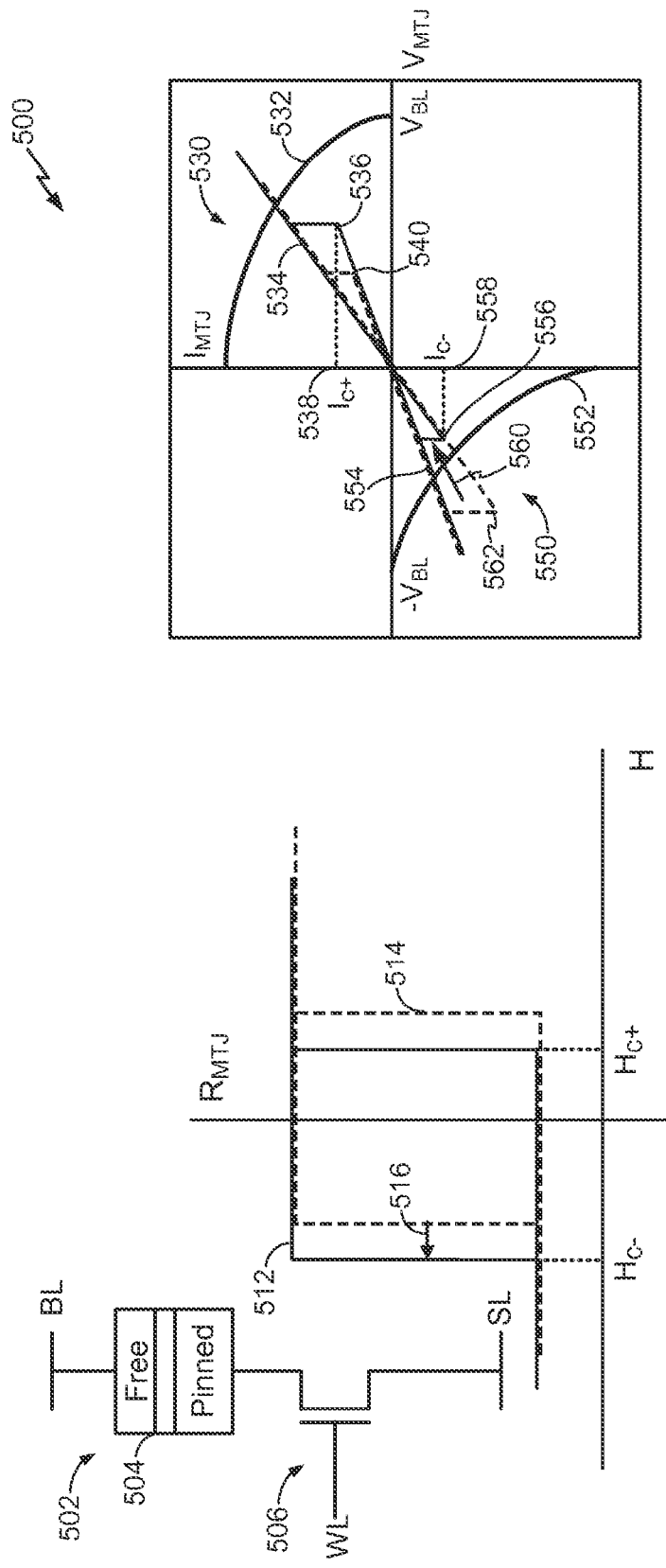
FIG. 5 is a diagram of a first embodiment of operating characteristics of a memory cell.

FIG. 5 is a diagram of a first embodiment of operating characteristics 500 of a memory cell 502. The memory cell 502 has a configuration where a MTJ device 504 has a free layer deposited above a pinned layer, and the pinned layer is electrically coupled to a drain terminal of a transistor 506 (a "normal" connection). In a particular embodiment, the memory cell 502 is the memory cell 116 of FIG. 1 or the memory cell 200 of FIG. 2, includes the MTJ structure 300 of FIG. 3 or the MTJ structure 400 of FIG. 4, or any combination thereof.

The MTJ device 504 has a resistance (R) that exhibits hysteresis as a function of magnetic field (H), illustrated as a resistance-magnetic field loop (R-H loop) 514 that is "balanced," i.e. centered at zero. Beginning at a large negative value of H, such as caused by a large current through the MTJ in a first direction, the resistance has a low value. The resistance remains low as H crosses zero (i.e. changes direction). At a particular field strength, corresponding to a thermal barrier for P-to-AP switching, the resistance increases to a high value, representing a change of the magnetic moment of the free layer, and a writing of a data bit to the memory cell 502. As the field decreases past zero, the resistance remains high until the resistance returns to its low value when the magnetic moment of the free layer returns to its original orientation, i.e., when a data bit of opposite value is written to the memory cell 502.

A negative shift 516 is applied to the balanced R-H loop 514 by modifying an offset magnetic field by adjusting a physical dimension of the adjacent layers, such as a thickness of the pinned layer or of one or more layers within the adjacent layers. The resulting unbalanced R-H loop 512 illustrates a transition from the low resistance state (i.e., the AP state) to the high resistance state (i.e., the P state) occurs at $H_{C+}$, and a transition from the high resistance state to the low resistance state (i.e., the AP state) occurs at $H_{C-}$. The negative shift 516 shifts both $H_{C-}$ and $H_{C+}$ in a negative direction such that a magnitude of $H_{C-}$ is greater than a magnitude of $H_{C+}$.

A load line characteristic corresponding to operation of the memory cell 502 configured to have the unbalanced R-H loop 512 is depicted in a first bias condition 530 and a second bias condition 550. In the first bias condition 530, a characteristic of the MTJ device 504 as a function of a voltage across the MTJ device 504, with the source line (SL) grounded and the bit line (BL) biased at a positive voltage ($V_{BL}$), is illustrated by a MTJ current-voltage (I-V) curve 534. A characteristic of the transistor 506 having a positive gate voltage $V_G$ is illustrated by a transistor I-V curve 532 as a function of the voltage across the MTJ device 504. An intersection of the MTJ I-V curve 534 and the transistor I-V curve 532 indicates an operating point of the memory cell, and the voltage value at the operating point must be larger than a switching voltage for stable writing operations.

The MTJ I-V curve 534 illustrates that as the voltage across the MTJ device 504 increases from zero, the current through the MTJ device 504 increases. Following the lower line, which represents a higher-resistance state of the MTJ device 504 (i.e., the AP state), current increases with voltage until a transition 536 indicates a switch to the lower-resistance state (i.e., the P state). The transition 536 occurs at a critical current $I_{C+}$ 538 when a current density through the MTJ device 504 equals the critical current density $J_{C(AP \rightarrow P)}$. Current though the MTJ device 504 continues to increase with increasing voltage at a rate corresponding to the lower resistance state. As voltage across the MTJ device 504 decreases, the current through the MTJ device 504 decreases substantially linearly in the lower resistance state.

In the second bias condition 550, a characteristic of the MTJ device 504 as a function of a voltage across the MTJ device 504, with the source line (SL) biased at $V_{BL}$ and the bit line (BL) grounded, is illustrated by a MTJ current-voltage (I-V) curve 556. A characteristic of the transistor 506 having a negative gate voltage $-V_G$ is illustrated by a transistor I-V curve 552 as a function of the voltage across the MTJ device 504. An intersection of the MTJ I-V curve 554 and the transistor I-V curve 552 indicates a stable operating point of the memory cell 502.

The transistor I-V curve 552 demonstrates a reduced current compared to the transistor I-V curve 532 as a result of the source loading effect. In particular, when the transistor 506 is an n-channel metal-oxide-semiconductor (NMOS)-type field effect transistor, in the first bias condition 530 the gate-source voltage difference ($V_{GS}$) is a constant $V_G$. In contrast, under the second bias condition 550 the gate-source voltage difference varies with the voltage across the MTJ device 504 ($V_{MTJ}$).

The MTJ I-V curve 544 illustrates that as the voltage across the MTJ device 504 increases in magnitude from zero (i.e. becomes more negative), the current through the MTJ device 504 increases in magnitude (i.e. increased current flow) in an opposite direction than in the operating state 530. Following the lower line, which represents the P state of the MTJ device 504, current through the MTJ device 504 increases in magnitude with voltage until a transition 556 indicates a switch to the AP state. The transition 556 occurs at a critical current $I_{C-}$ 558 when a current density through the MTJ device 504 equals the critical current density $J_{C(P \to AP)}$. After the transition to a reduced current, the current though the MTJ device 504 continues to increase in magnitude with voltage at a rate corresponding to the higher resistance state. As voltage across the MTJ device 504 returns toward zero from a negative value, the magnitude of the current through the MTJ device 504 decreases substantially linearly in the higher resistance state.

A loadline analysis of the memory cell 502 indicates that the transistor 506 provides sufficient current to enable the MTJ device to switch from the AP state to the P state in the first bias condition 530 and also to switch from the P state to the AP state in the second bias condition 550. However, as indicated by the illustrated by the dashed lines representing the MTJ I-V curve corresponding to the balanced R-H loop 514, without generating offset magnetic field to cause the negative shift 516 of the balanced R-H loop 514, a P→AP transition 562 requires a larger current than can be provided by the transistor device 506 in the second bias condition 550. As a result, the memory cell 502 is unstable with the balanced R-H loop 514 and data cannot reliably be written to the memory cell 502 without applying the negative shift 516 that generates a shift 560 in the MTJ I-V curves.

The shift 560 shifts the P→AP transition 562 to the transition 556 occurring at a smaller magnitude current density $J_{C(P \to AP)}$ and shifts the AP→P transition 540 to the transition 536 occurring at a larger magnitude current density $J_{C(AP \to P)}$. Thus, generating the offset magnetic field to cause the negative shift 516, such as by adjusting a thickness of a pinned layer of the MTJ device 504, causes the shift 560 in the MTJ I-V response and results in an decreased ratio of $|J_{C(P \to AP)}|/J_{C(AP \to P)}$, which enables stable operation and correct switching of the memory cell 502.

Figure 6:
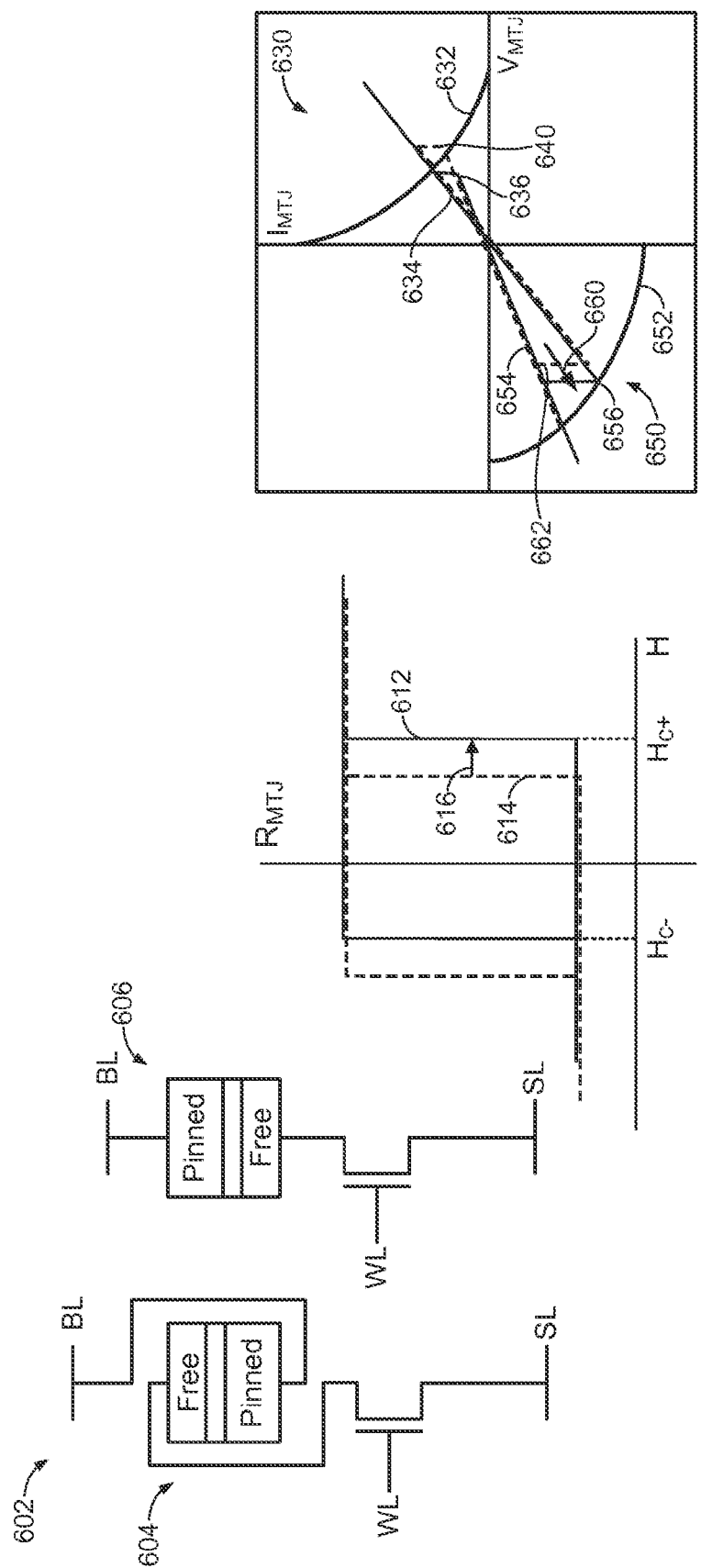
FIG. 6 is a diagram of a second embodiment of operating characteristics of a memory cell.

FIG. 6 is a diagram of a second embodiment of operating characteristics of a memory cell 602. The memory cell 602 may have a first configuration 604 where a MTJ device has a free layer deposited above a pinned layer, and is "reverse connected" such that the free layer is electrically coupled to a drain terminal of the transistor via a conductive path. For example, the conductive path may include wires, vias, and contacts that electrically connect the drain terminal to a top electrode of the MTJ device. The memory cell 602 may alternatively have a second configuration 606 where the MTJ device has a "reversed layer" structure where a pinned layer is deposited above a free layer, and the free layer is electrically coupled to a drain terminal of the transistor. In a particular embodiment, the memory cell 602 is the memory cell 116 of FIG. 1.

The MTJ device 602 in either configuration 604 or 606 can have a resistance-magnetic field loop (R-H loop) 614 that is "balanced," i.e. centered at zero. A positive shift 616 is applied to the balanced R-H loop 614 by modifying an offset magnetic field by adjusting a physical dimension of the adjacent layers, such as a thickness of the pinned layer or of one or more layers within the pinned layer. A resulting unbalanced R-H loop 612 illustrates a transition from the low resistance state (i.e., the P state) to the high resistance state (i.e., the AP state) occurs at $H_{C+}$, and a transition from the high resistance state to the high resistance state (i.e., the AP state) occurs at $H_{C-}$. The positive shift 616 shifts both $H_{C-}$ and $H_{C+}$ in a positive direction such that a magnitude of $H_{C+}$ is greater than a magnitude of $H_{C-}$.

A load line characteristic corresponding to operation of the memory cell 602 configured to have the unbalanced R-H loop 612 is depicted in a first bias condition 630 and a second bias condition 650. In the first bias condition 630, a characteristic of the MTJ device as a function of a voltage across the MTJ device, with the source line (SL) grounded and the bit line (BL) biased at a positive voltage ($V_{BL}$), is illustrated by a MTJ current-voltage (I-V) curve 634. A characteristic of the transistor having a positive gate voltage $V_G$ is illustrated by a transistor I-V curve 632 as a function of the voltage across the MTJ device. An intersection of the MTJ I-V curve 634 and the transistor I-V curve 632 indicates a stable operating point of the memory cell.

The transistor I-V curve 632 exhibits a source loading effect similar to the source loading effect described in FIG. 5 (with reversed bias conditions). As previously discussed, MTJ switching asymmetry tends to require a larger current for P→AP switching than for AP→P switching, i.e. $J_{C(AP \to P)} < J_{C(P \to AP)}$. By reversing the connection or the layer deposition of the MTJ device, the reduced transistor current due to source loading effect may have a less impact because of the smaller switching current required in the first bias condition 630. However, as indicated by the dashed lines, operating under the balanced R-H loop 614 conditions requires a larger current at the AP→P transition 640 than can be provided by the transistor due to the source loading effect.

Under the second bias condition 650, a characteristic of the MTJ device as a function of a voltage across the MTJ device, with the source line (SL) biased at $V_{BL}$ and the bit line (BL) grounded, is illustrated by a MTJ current-voltage (I-V) curve 654. A characteristic of the transistor having a negative gate voltage $-V_G$ is illustrated by a transistor I-V curve 652 as a function of the voltage across the MTJ device. An intersection of the MTJ I-V curve 654 and the transistor I-V curve 652 indicates a stable operating point of the memory cell 602.

A loadline analysis of the memory cell 602 indicates that the transistor provides sufficient current to enable the MTJ device to switch from the AP state to the P state in the first bias condition 630 and also to switch from the P state to the AP state in the second region when the positive shift 616 is applied to generate the unbalanced R-H curve 612, which results in a shift 660 of the MTJ transitions 640 and 662 to transitions 636 and 656, respectively. The shift 660 is a negative shift that reduces the magnitude of the critical current in the first bias condition 630 and increases the magnitude of the critical current in the second bias condition 650, so that the transistor of the memory cell 602 can provide enough current to enable stable operation and proper switching of the MTJ device.

The shift 660 shifts the P→AP transition 662 to the transition 656 occurring at a larger magnitude current density $J_{C(P \to AP)}$ and shifts the AP→P transition 640 to the transition 636 occurring at a smaller magnitude current density $J_{C(AP \to P)}$. Thus, generating the offset magnetic field to cause the positive shift 616, such as by adjusting a thickness of a pinned layer of the MTJ device, causes the shift 660 in the MTJ I-V response and results in an increased ratio of $|J_{C(P \to AP)}|/J_{C(AP \to P)}$, which enables stable operation and correct switching of the memory cell 602.

Although FIG. 5 and FIG. 6 illustrate embodiments where a shift from a balanced R-H loop condition by applying a sufficient offset field results in the memory cell becoming stable, these embodiments demonstrating unstable behavior with balanced R-H loops and stable behavior with unbalanced R-H loops are used for ease of explanation and not as limitations. In general, proper operation of the memory cell may be independent of whether the R-H loop is balanced. Instead, adjusting a memory cell to achieve proper operation may be based on determining a direction and magnitude to shift the R-H loop to adjust the switching current levels to levels achievable by the transistor under operating bias conditions (i.e. shifting the transition points to occur within the transistor I-V curves in the loadlines illustrated in FIGS. 5-6). Thus, an adjustment of the switching current levels to result in stable operation may indicate an amount to shift the R-H loop, which in turn may indicate an adjustment of an offset field to effect the shift of the R-H loop, which in turn may indicate a change in a one or more physical dimensions (such as layer thicknesses) of the pinned layer to adjust the offset field.

Figure 7:
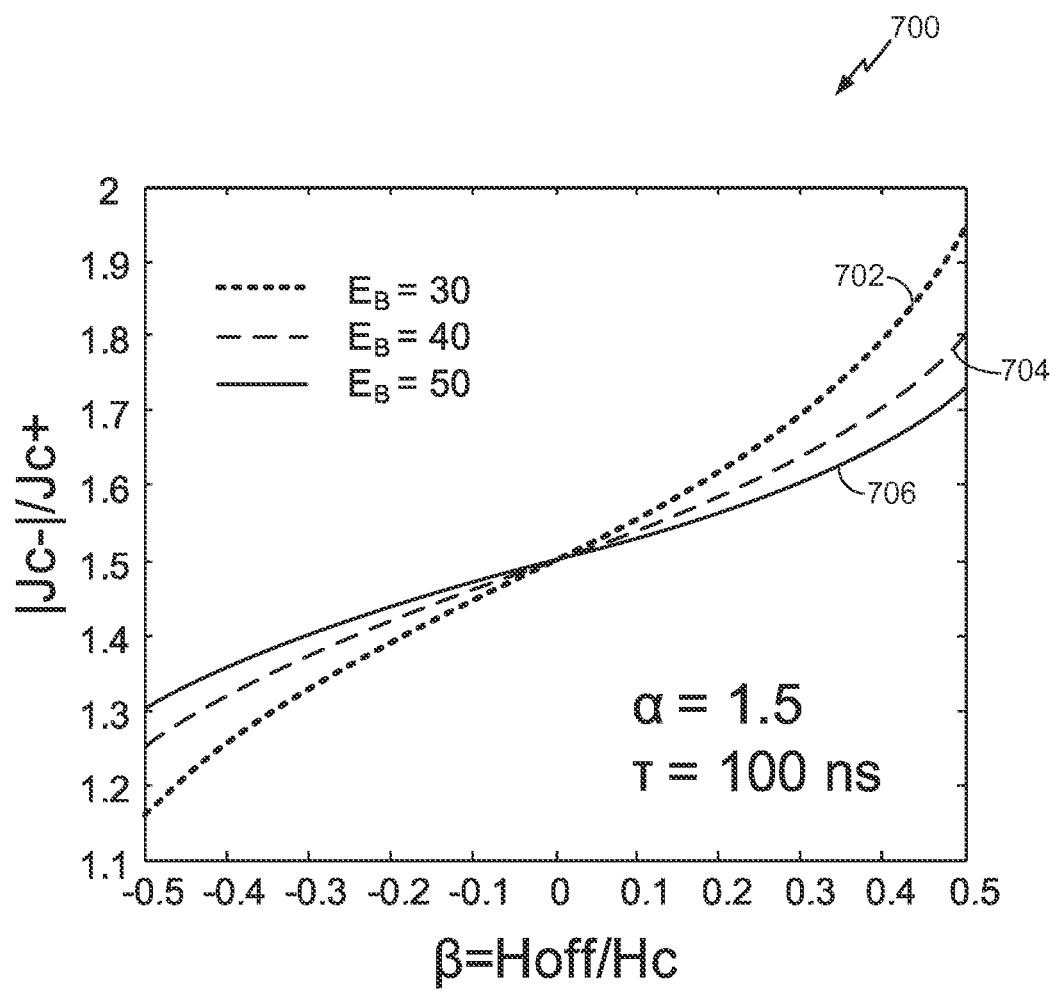
FIG. 7 is a diagram illustrating a model of a relationship between a switching current ratio and a magnetic field ratio that can be used to determine a programmed offset magnetic field.

FIG. 7 is a diagram illustrating a model 700 of a relationship between a switching current ratio and a magnetic field ratio that can be used to determine a programmed offset magnetic field. The model 700 illustrates the switching current ratio $|J_{C-}|/J_{C+}$, (e.g., $|J_{C(P \to AP)}|/J_{C(AP \to P)}$ as discussed with respect to FIGS. 5-6) as a function of magnetic field ratio $H_{off}/H_c$, referred to as $\beta$, for three different values of thermal stability $E_B$, shown as curves 702, 704, and 706.

In a particular embodiment, the model 700 is a theoretical model based on $$J_{c\pm} = J_{c0\pm}\left[1 - \frac{k_B T}{E_{B\pm}}\ln\left(\frac{\tau}{\tau_0}\right)\right]$$

where $J_{c0\pm}$ is a critical current density, $k_B$ is Boltzmann's constant, T is temperature, and $\tau/\tau_0$ represents a ratio of a write current duration $\tau$ to a constant parameter $\tau_0$. $E_{B\pm}$ is a thermal stability given by $$E_{B\pm} = \frac{M_S V |H_{c\mp}|}{2} = \frac{M_S V}{2}(H_c \mp H_{off})$$

$$= \frac{M_S V H_c}{2}(1 \mp \beta) = E_B(1 \mp \beta)$$

where $M_S$ is the saturation magnetization. V is the volume of a MTJ, and $\beta$ is $H_{off}/H_c$.

The switching current ratio $|J_{C-}|/J_{C+}$ is given by $$\frac{|J_{c-}|}{J_{c+}} = \frac{|J_{c0-}|}{J_{c0+}} \frac{1 - \frac{k_B T}{E_B}\ln\left(\frac{\tau}{\tau_0}\right)\frac{1}{1+\beta}}{1 - \frac{k_B T}{E_B}\ln\left(\frac{\tau}{\tau_0}\right)\frac{1}{1-\beta}} = \alpha \frac{1 - \frac{c}{1+\beta}}{1 - \frac{c}{1-\beta}}$$

where $$\alpha = \frac{|J_{c0-}|}{J_{c0+}}, \beta = \frac{H_{off}}{H_c}, c = \frac{k_B T}{E_B}\ln\left(\frac{\tau}{\tau_0}\right)$$

The model 700 may be based on basic STT switching theory, or in other embodiments the model 700 may be adjusted by additional physical simulation or modeling, or an empirical model, or any combination thereof.

The model 700 provides a relationship between the switching current ratio 1, the offset magnetic field $H_{off}$ and a switching field strength $H_c$. For example, a switching current ratio can be determined that enables stable operation of a memory cell, and the model 700 can be accessed to determine an amount to modify an offset magnetic field to adjust operation of a MTJ device of the memory cell to have the switching current ratio.

Figure 8:
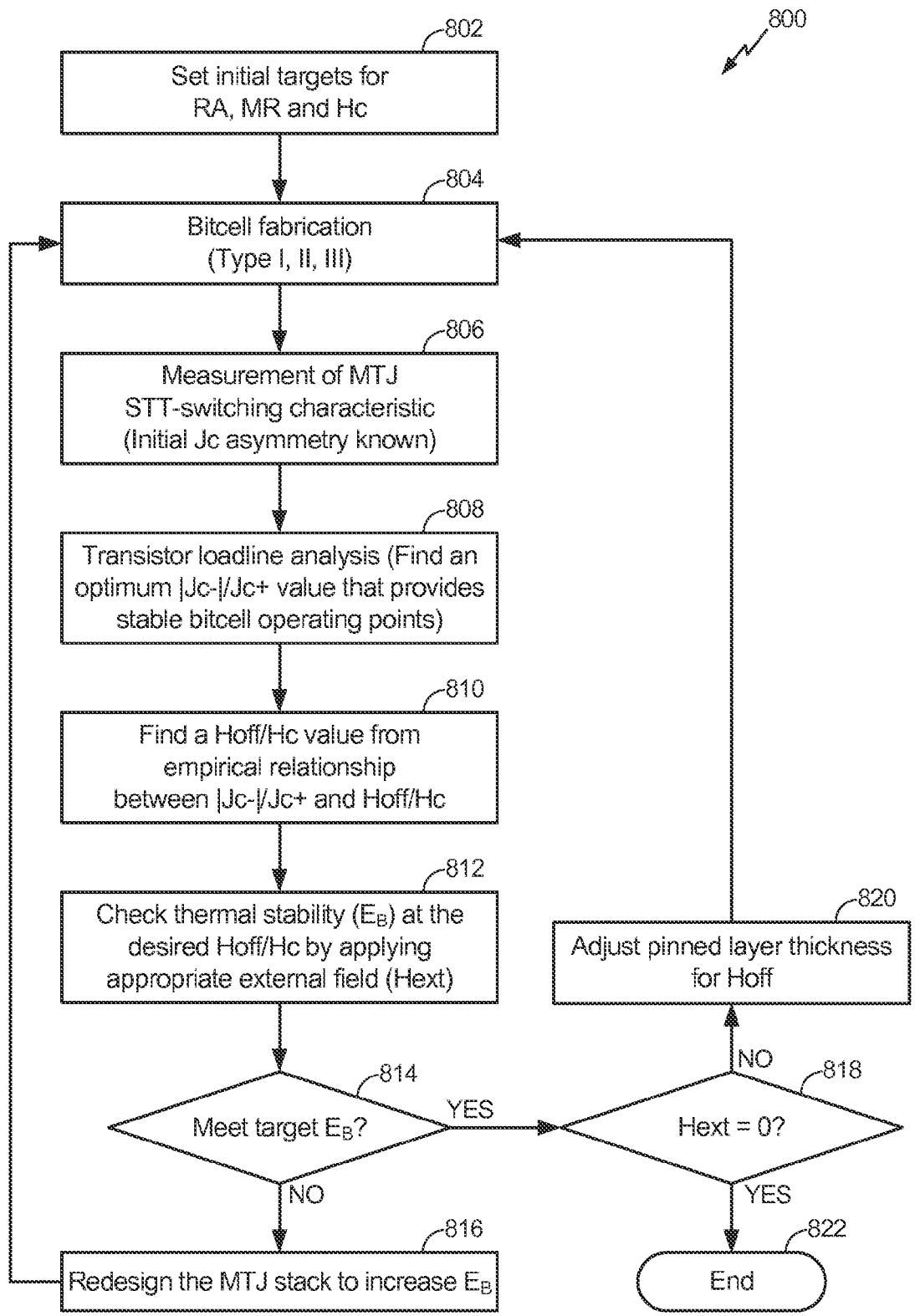
FIG. 8 is a flow diagram of a method of reducing a source loading effect of a spin torque transfer magnetoresistive random access memory (STT-MRAM)

FIG. 8 is a flow diagram of a particular embodiment of a method 800 of reducing a source loading effect of a spin torque transfer magnetoresistive random access memory (STT-MRAM).

At 802, initial targets for RA, MR, and $H_c$ may be set to meet specifications for a target application. Typically, the read circuitry sets the threshold for MR, and RA is determined considering STT switching characteristics of a target MTJ structure and breakdown characteristics of the tunneling insulator. In addition, a target Hc value may be limited by minimum thermal stability ($E_B$) required and can be controlled by adjusting aspect ratio of the MTJ.

Continuing to 804, various bitcells with different transistor widths may be fabricated, such as a memory cell including a MTJ structure serially coupled to an access transistor. For example, the memory cell may be the memory cell 116 of FIG. 1, the memory cell 200 of FIG. 2, the memory cell 502 of FIG. 5, or the memory cell 602 of FIG. 6. The memory cell may have a first configuration, such as the configuration of the memory cell 502 of FIG. 5 ("Type I"), a second configuration, such as the configuration 604 of the memory cell 602 of FIG. 6 ("Type II"), or a third configuration, such as the configuration 606 of the memory cell 602 of FIG. 6 ("Type III").

Advancing to 806, a switching characteristic of the memory cell may be determined. For example, a spin torque transfer (STT) switching characteristic of the memory cell may be measured. An initial critical current density $J_c$ asymmetry may be known.

Moving to 808, a transistor loadline analysis may be performed to determine the switching current ratio that enables stable operation of the memory cell. Note that loadlines can be varied by changing transistor width and word line voltages. Optimum combination of transistor width, word line voltage, and possible offset field values can be estimated. A switching current ratio of a magnetic tunnel junction (MTJ) structure is determined that enables stable operation of the memory cell. The switching current ratio may be based on a first critical current density to switch from the first state to the second state divided by a second critical current density to switch from the second state to the first state, such as the ratio $|J_{C(P \to AP)}|/J_{C(AP \to P)}$, as described with respect to FIGS. 5-6 or $|J_{C-}/J_{C+}|$, as described with respect to FIG. 7.

Proceeding to 810, an amount to modify the offset magnetic field ($H_{off}$) may be determined based on a magnitude of the switching current ratio $|J_{C-}/J_{C+}|$. For example, the amount to modify the offset magnetic field $H_{off}$ may be determined using a mathematical model of a relationship between the switching current ratio $|J_{C-}|/J_{C+}$, the offset magnetic field $H_{off}$, and a switching field strength ($H_c$). Specifically, a value of $H_{off}/H_c$ may be determined from a relationship between $|J_{C-}|/J_{C+}$ and $H_{off}/H_c$ such as discussed with respect to FIG. 7. As another example, the amount to modify the offset magnetic field $H_{off}$ may be determined using an empirical model of a relationship between the switching current ratio $|J_{C-}|/J_{C+}$, the offset magnetic field $H_{off}$, and the switching field strength H.

The offset magnetic field $H_{off}$ may be attainable by modifying a physical dimension of the MTJ structure, such as by modifying one or more layer thicknesses in the pinned layer, as discussed with respect to FIG. 4. However, such a modified memory cell may not have sufficient thermal stability for operation.

Continuing to 812, an external magnetic field ($H_{ext}$) may be applied to simulate operation of the MTJ structure with the adjusted thickness of the pinned layer. A thermal stability ($E_B$) of the memory cell in the presence of the external magnetic field may be tested, to predict a thermal stability of the memory cell after adjustment to attain the offset magnetic field $H_{off}$.

Advancing to decision 814, a determination is made whether the memory cell meets a target thermal stability. Where the target thermal stability is not met, the MTJ stack may be redesigned to increase the thermal stability, at 816. For example, the MTJ structure may be redesigned when the predicted thermal stability does not satisfy a predetermined threshold. One example of redesigning the MTJ structure is to change the design to a "reversed" memory cell configuration, such as the configuration 604 or 606 of the memory cell 602 of FIG. 6, to relax a switching current requirement under bias conditions that result in the source loading effect, such as described with respect to FIGS. 5-6.

Where the target thermal stability is met, a determination may be made whether the external field is substantially zero, at 818. Where the external field is determined to be substantially zero, the method may end, at 822, because proper switching operation has been achieved in a thermally stable design.

Otherwise, where the external field is determined to not be substantially zero, the pinned layer thickness may be adjusted for $H_{off}$, at 820. The thickness that is adjusted may be a thickness of one or more particular layers of a synthetic pinned layer and may be determined using a model such as the model 422 of FIG. 4. The thickness of the pinned layer of the MTJ structure is adjusted to modify the offset magnetic field $H_{off}$ that is coupled to a free layer of the MTJ structure. The modified offset magnetic field causes the MTJ structure to exhibit the switching current ratio $|J_{C-}|/J_{C+}$ that is determined to enable stable operation at the memory cell. For example, the offset magnetic field may be modified by adding a positive field component that decreases the switching current ratio. In a particular embodiment, when the thickness of the pinned layer is adjusted to increase the offset magnetic field, the switching current ratio is reduced.

After adjusting the pinned layer thickness, at 820, or after redesigning the MTJ structure, at 816, processing may return to 804, where the bitcell may be fabricated using the adjusted or redesigned properties. A memory cell having the adjusted thickness of the pinned layer of the MTJ structure as determined by the method 800 may therefore be fabricated at 804, and where the memory cell satisfies the decisions at 814 and 818, a design of the memory cell may be stored into a design library or other electronic design tool and used as a component of other devices. For example, a STT-MRAM memory can be designed in accordance with the method 800. Memory cells designed in accordance with the method 800 or in accordance with other embodiments described herein may be incorporated in a variety of devices, such as a mobile phone, a set-top box device, a computer, a personal digital assistant (PDA), a music player, a video player, any other device that stores or retrieves data or computer instructions, or any combination thereof.

In other embodiment, the method 800 may not include fabricating bitcells, and may instead perform physical system simulations to predict behavior of bitcell designs as part of an automated design process or design tool. For example, in a particular embodiment, all or part of the method 800 may be performed by dedicated circuitry, field programmable gate arrays, a processor executing computer readable instructions that are tangibly embodied in a computer readable medium, such as a processor executing software stored in a computer memory, other tangible physical devices configured to implement all or part of the method 800, or any combination thereof, to iteratively improve a STT-MRAM memory cell design prior to fabricating a memory using the memory cell design.

Referring to FIG. 9, a block diagram of a particular illustrative embodiment of a portable electronic device including a resistance based memory including memory cells with programmed offset magnetic fields is depicted and generally designated 900. The device 900 includes a processor, such as a digital signal processor (DSP) 910, coupled to a memory 932 and also coupled to the resistance based memory 964 that includes memory cells with programmed offset magnetic fields. In an illustrative example, the resistance based memory 964 includes the memory device 100 depicted in FIG. 1, or includes one or more of the memory cells 200, 502, 602, or 606 depicted in FIGS. 2, 5, and 6, respectively, or is formed in accordance with the method 800 of FIG. 8, or any combination thereof. In a particular embodiment, the resistance based memory 964 is a spin torque transfer magnetoresistive random access memory (STT-MRAM).

FIG. 9 also shows a display controller 926 that is coupled to the digital signal processor 910 and to a display 928. A coder/decoder (CODEC) 934 can also be coupled to the digital signal processor 910. A speaker 936 and a microphone 938 can be coupled to the CODEC 934. FIG. 9 also indicates that a wireless transceiver 940 can be coupled to the digital signal processor 910 and to a wireless antenna 942.

The processor 910 is configured to perform memory operations at individual memory cells or groups of memory cells of the resistance based memory 964. For example, the processor 910 may be configured to store data at the resistance based memory 964 that is received via the antenna 942 and the wireless transceiver 940, such as audio data or video data received via a wireless communication network. The processor 910 may be configured to retrieve data stored at the resistance based memory 964 to initiate data presentation, such as to display at the display device 928, to generate at the speaker 936, or any combination thereof.

In a particular embodiment, the DSP 910, the display controller 926, the memory 932, the CODEC 934, the wireless transceiver 940, and the resistance-based-memory 964 are included in a system-in-package or system-on-chip device 922. In a particular embodiment, an input device 930 and a power supply 944 are coupled to the system-on-chip device 922. Moreover, in a particular embodiment, as illustrated in FIG. 9, the display 928, the input device 930, the speaker 936, the microphone 938, the wireless antenna 942, and the power supply 944 are external to the system-on-chip device 922. However, each of the display 928, the input device 930, the speaker 936, the microphone 938, the wireless antenna 942, and the power supply 944 can be coupled to a component of the system-on-chip device 922, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 10 depicts a particular illustrative embodiment of an electronic device manufacturing process 1000.

Physical device information 1002 is received in the manufacturing process 1000, such as at a research computer 1006. The physical device information 1002 may include design information representing at least one physical property of a semiconductor device, such as the memory device 100 of FIG. 1, the memory cell 200 of FIG. 2, the memory cell 502 of FIG. 5, the memory cell 602 having the configuration 604 or 606 of FIG. 6, or any combination thereof. For example the physical device information 1002 may include physical parameters, material characteristics, and structure information that is entered via a user interface 1004 coupled to the research computer 1006. The research computer 1006 includes a processor 1008, such as one or more processing cores, coupled to a computer readable medium such as a memory 1010. The memory 1010 may store computer readable instructions that are executable to cause the processor 1008 to transform the physical device information 1002 to comply with a file format and to generate a library file 1012.

In a particular embodiment, the library file 1012 includes at least one data file including the transformed design information. For example, the library file 1012 may include a library of semiconductor devices including the memory device 100 of FIG. 1, the memory cell 200 of FIG. 2, the memory cell 502 of FIG. 5, the memory cell 602 having the configuration 604 or 606 of FIG. 6, or any combination thereof, that is provided for use with an electronic design automation (EDA) tool 1020.

The library file 1012 may be used in conjunction with the EDA tool 1020 at a design computer 1014 including a processor 1016, such as one or more processing cores, coupled to a memory 1018. The EDA tool 1020 may be stored as processor executable instructions at the memory 1018 to enable a user of the design computer 1014 to design a circuit using the memory device 100 of FIG. 1, the memory cell 200 of FIG. 2, the memory cell 502 of FIG. 2, the memory cell 602 having the configuration 604 or 606 of FIG. 6, or any combination thereof, of the library file 1012. For example, a user of the design computer 1014 may enter circuit design information 1022 via a user interface 1024 coupled to the design computer 1014. The circuit design information 1022 may include design information representing at least one physical property of a semiconductor device, such as the memory device 100 of FIG. 1, the memory cell 200 of FIG. 2, the memory cell 502 of FIG. 5, the memory cell 602 having the configuration 604 or 606 of FIG. 6, or any combination thereof. To illustrate, the circuit design property may include identification of particular circuits and relationships to other elements in a circuit design, positioning information, feature size information, interconnection information, or other information representing a physical property of a semiconductor device.

The design computer 1014 may be configured to transform the design information, including the circuit design information 1022 to comply with a file format. To illustrate, the file formation may include a database binary file format representing planar geometric shapes, text labels, and other information about a circuit layout in a hierarchical format, such as a Graphic Data System (GDSII) file format. The design computer 1014 may be configured to generate a data file including the transformed design information, such as a GDSII file 1026 that includes information describing the memory device 100 of FIG. 1, the memory cell 200 of FIG. 2, the memory cell 502 of FIG. 5, the memory cell 602 having the configuration 604 or 606 of FIG. 6, or any combination thereof, in addition to other circuits or information. To illustrate, the data file may include information corresponding to a system-on-chip (SOC) that includes the memory device 100 of FIG. 1 and that also includes additional electronic circuits and components within the SOC.

The GDSII file 1026 may be received at a fabrication process 1028 to manufacture the memory device 100 of FIG. 1, the memory cell 200 of FIG. 2, the memory cell 502 of FIG. 5, the memory cell 602 having the configuration 604 or 606 of FIG. 6, or any combination thereof, according to transformed information in the GDSII file 1026. For example, a device manufacture process may include providing the GDSII file 1026 to a mask manufacturer 1030 to create one or more masks, such as masks to be used for photolithography processing, illustrated as a representative mask 1032. The mask 1032 may be used during the fabrication process to generate one or more wafers 1034, which may be tested and separated into dies, such as a representative die 1036. The die 1036 includes a circuit including the memory device 100 of FIG. 1, the memory cell 200 of FIG. 2, the memory cell 502 of FIG. 5, the memory cell 602 having the configuration 604 or 606 of FIG. 6, or any combination thereof.

The die 1036 may be provided to a packaging process 1038 where the die 1036 is incorporated into a representative package 1040. For example, the package 1040 may include the single die 1036 or multiple dies, such as a system-in-package (SiP) arrangement. The package 1040 may be configured to conform to one or more standards or specifications, such as Joint Electron Device Engineering Council (JEDEC) standards.

Information regarding the package 1040 may be distributed to various product designers, such as via a component library stored at a computer 1046. The computer 1046 may include a processor 1048, such as one or more processing cores, coupled to a memory 1050. A printed circuit board (PCB) tool may be stored as processor executable instructions at the memory 1050 to process PCB design information 1042 received from a user of the computer 1046 via a user interface 1044. The PCB design information 1042 may include physical positioning information of a packaged semiconductor device on a circuit board, the packaged semiconductor device corresponding to the package 1040 including the memory device 100 of FIG. 1, the memory cell 200 of FIG. 2, the memory cell 502 of FIG. 5, the memory cell 602 having the configuration 604 or 606 of FIG. 6, or any combination thereof.

The computer 1046 may be configured to transform the PCB design information 1042 to generate a data file, such as a GERBER file 1052 with data that includes physical positioning information of a packaged semiconductor device on a circuit board, as well as layout of electrical connections such as traces and vias, where the packaged semiconductor device corresponds to the package 1040 including the memory device 100 of FIG. 1, the memory cell 200 of FIG. 2, the memory cell 502 of FIG. 5, the memory cell 602 having the configuration 604 or 606 of FIG. 6, or any combination thereof. In other embodiments, the data file generated by the transformed PCB design information may have a format other than a GERBER format.

The GERBER file 1052 may be received at a board assembly process 1054 and used to create PCBs, such as a representative PCB 1056, manufactured in accordance with the design information stored within the GERBER file 1052. For example, the GERBER file 1052 may be uploaded to one or more machines for performing various steps of a PCB production process. The PCB 1056 may be populated with electronic components including the package 1040 to form a represented printed circuit assembly (PCA) 1058.

The PCA 1058 may be received at a product manufacture process 1060 and integrated into one or more electronic devices, such as a first representative electronic device 1062 and a second representative electronic device 1064. As an illustrative, non-limiting example, the first representative electronic device 1062, the second representative electronic device 1064, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 1062 and 1064 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-9 may illustrate remote units according to the teachings of the disclosure, the disclosure is not limited to these exemplary illustrated units. Embodiments of the disclosure may be suitably employed in any device which includes active integrated circuitry including memory and on-chip circuitry for test and characterization.

Thus, the memory device 100 of FIG. 1, the memory cell 200 of FIG. 2, the memory cell 502 of FIG. 5, the memory cell 602 having the configuration 604 or 606 of FIG. 6, or any combination thereof, may be fabricated, processed, and incorporated into an electronic device, as described in the illustrative process 1000. One or more aspects of the embodiments disclosed with respect to FIGS. 1-9 may be included at various processing stages, such as within the library file 1012, the GDSII file 1026, and the GERBER file 1052, as well as stored at the memory 1010 of the research computer 1006, the memory 1018 of the design computer 1014, the memory 1050 of the computer 1046, the memory of one or more other computers or processors (not shown) used at the various stages, such as at the board assembly process 1054, and also incorporated into one or more other physical embodiments such as the mask 1032, the die 1036, the package 1040, the PCA 1058, other products such as prototype circuits or devices (not shown), or any combination thereof. Although various representative stages of production from a physical device design to a final product are depicted, in other embodiments fewer stages may be used or additional stages may be included. Similarly, the process 1000 may be performed by a single entity, or by one or more entities performing various stages of the process 1000.

Those of skill would further appreciate that the various illustrative logical blocks, configurations, modules, circuits, and algorithm steps described in connection with the embodiments disclosed herein may be implemented as electronic hardware, computer software, or combinations of both. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disk read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a magnetic tunnel junction (MTJ) structure including:
a free layer;
an antiferromagnetic layer; and
a pinned layer positioned between the free layer and the antiferromagnetic layer, wherein the pinned layer is distinct from the antiferromagnetic layer, and wherein a magnetic moment of the free layer is substantially parallel to a magnetic moment of the pinned layer in a first state and substantially antiparallel to the magnetic moment of the pinned layer in a second state,
wherein the pinned layer has a physical dimension to produce an offset magnetic field that causes the MTJ structure to exhibit a switching current ratio that enables stable operation of the free layer, and
wherein the switching current ratio includes a ratio of a first magnitude of a first switching current to a second magnitude of a second switching current, the first switching current to enable switching from the first state to the second state and the second switching current to enable switching from the second state to the first state; and
an access transistor coupled to the MTJ structure.

2. The apparatus of claim 1, wherein the first switching current is less than a first threshold associated with an operating current characteristic of the access transistor, and wherein the operating current characteristic of the access transistor comprises a current from a drain terminal of the access transistor to a source terminal of the access transistor at a predetermined voltage between a gate terminal of the access transistor and the drain terminal of the access transistor.

3. The apparatus of claim 2, wherein the free layer is positioned a first distance from the drain terminal and the pinned layer is positioned a second distance from the drain terminal, the first distance greater than the second distance, and wherein a conductive path electrically connects the drain terminal to the free layer.

4. The apparatus of claim 2, wherein the free layer is positioned a first distance from the drain terminal and the pinned layer is positioned a second distance from the drain terminal, the second distance greater than the first distance, and wherein a conductive path electrically connects the drain terminal to the free layer.

5. The apparatus of claim 1, wherein the pinned layer includes a first magnetic layer, a non-magnetic layer, and a second magnetic layer, wherein the second magnetic layer is positioned between the non-magnetic layer and the antiferromagnetic layer, and wherein the physical dimension corresponds to a thickness of the second magnetic layer.

6. The apparatus of claim 1, further comprising a device selected from a set top box, a music player, a video player, an entertainment unit, a navigation device, a communications device, a personal digital assistant (PDA), a fixed location data unit, and a computer, into which the MTJ structure is integrated.

7. An apparatus comprising:
means for storing a data value as an orientation of a magnetic moment that is programmable by a spin polarized current exceeding a threshold current density;
means for storing a pinned magnetic moment having a pinned orientation, wherein the magnetic moment that is programmable is substantially parallel to the pinned magnetic moment in a first state and substantially antiparallel to the pinned magnetic moment in a second state; and
an antiferromagnetic layer that is distinct from the means for storing the pinned magnetic moment, wherein the means for storing the pinned magnetic moment is positioned between the means for storing the data value and the antiferromagnetic layer,
wherein the means for storing the pinned magnetic moment has a physical dimension to produce an offset magnetic field that causes a switching current ratio that enables stable operation of the means for storing the data value, and
wherein the switching current ratio includes a ratio of a first magnitude of a first switching current to a second magnitude of a second switching current, the first switching current to cause the means for storing the data value to switch from the first state to the second state and the second switching current to cause the means for storing the data value to switch from the second state to the first state.

8. The apparatus of claim 7, wherein the means for storing the data value, the means for storing the pinned magnetic moment, and the antiferromagnetic layer are integrated in at least one semiconductor die.

9. The apparatus of claim 7, further comprising a device selected from a set top box, a music player, a video player, an entertainment unit, a navigation device, a communications device, a personal digital assistant (PDA), a fixed location data unit, and a computer, into which the means for storing the data value and the means for storing the pinned magnetic moment are integrated.

10. A method comprising:
receiving design information representing at least one physical property of a semiconductor device, the semiconductor device including a magnetic tunnel junction (MTJ) structure including:
a free layer;
an antiferromagnetic layer; and
a pinned layer positioned between the free layer and the antiferromagnetic layer,
wherein the pinned layer is distinct from the antiferromagnetic layer, and
wherein a magnetic moment of the free layer is substantially parallel to a magnetic moment of the pinned layer in a first state and substantially antiparallel to the magnetic moment of the pinned layer in a second state,
wherein the pinned layer has a physical dimension to produce an offset magnetic field that causes the MTJ structure to exhibit a switching current ratio that enables stable operation of the free layer, and
wherein the switching current ratio includes a ratio of a first magnitude of a first switching current to a second magnitude of a second switching current, the first switching current to enable switching from the first state to the second state and the second switching current to enable switching from the second state to the first state;
transforming the design information to comply with a file format; and
generating a data file including the transformed design information.

11. The method of claim 10, wherein the data file includes a GDSII format.

12. A method comprising:
receiving a data file including design information corresponding to a semiconductor device; and
fabricating the semiconductor device according to the design information, wherein the semiconductor device includes a magnetic tunnel junction (MTJ) structure including:
a free layer;
an antiferromagnetic layer; and
a pinned layer positioned between the free layer and the antiferromagnetic layer, wherein the pinned layer is distinct from the antiferromagnetic layer, and wherein a magnetic moment of the free layer is substantially parallel to a magnetic moment of the pinned layer in a first state and substantially antiparallel to the magnetic moment of the pinned layer in a second state,
wherein the pinned layer has a physical dimension to produce an offset magnetic field that causes the MTJ structure to exhibit a switching current ratio that enables stable operation of the free layer, and
wherein the switching current ratio includes a ratio of a first magnitude of a first switching current to a second magnitude of a second switching current, the first switching current to enable switching from the first state to the second state and the second switching current to enable switching from the second state to the first state.

13. The method of claim 12, further comprising, prior to the data file being received:
determining the switching current ratio that enables the stable operation of the MTJ structure; and
modifying, based on the switching current ratio, the offset magnetic field by changing the physical dimension, wherein the design information includes the physical dimension.

14. A method comprising:
receiving design information including physical positioning information of a packaged semiconductor device on a circuit board, the packaged semiconductor device including a semiconductor structure comprising a magnetic tunnel junction (MTJ) structure including:
a free layer;
an antiferromagnetic layer; and
a pinned layer positioned between the free layer and the antiferromagnetic layer, wherein the pinned layer is distinct from the antiferromagnetic layer, and wherein a magnetic moment of the free layer is substantially parallel to a magnetic moment of the pinned layer in a first state and substantially antiparallel to the magnetic moment of the pinned layer in a second state,
wherein the pinned layer has a physical dimension to produce an offset magnetic field that causes the MTJ structure to exhibit a switching current ratio that enables stable operation of the free layer, and
wherein the switching current ratio includes a ratio of a first magnitude of a first switching current to a second magnitude of a second switching current, the first switching current to enable switching from the first state to the second state and the second switching current to enable switching from the second state to the first state; and transforming the design information to generate a data file.

15. The method of claim 14, wherein the data file has a GERBER format.

16. A method comprising:

receiving a data file including design information including physical positioning information of a packaged semiconductor device on a circuit board; and manufacturing the circuit board configured to receive the packaged semiconductor device according to the design information, wherein the packaged semiconductor device comprises a magnetic tunnel junction (MTJ) structure including:

a free layer;

an antiferromagnetic layer; and a pinned layer positioned between the free layer and the antiferromagnetic layer, wherein the pinned layer is distinct from the antiferromagnetic layer, and wherein a magnetic moment of the free layer is substantially parallel to a magnetic moment of the pinned layer in a first state and substantially antiparallel to the magnetic moment of the pinned layer in a second state, wherein the pinned layer has a physical dimension to produce an offset magnetic field that causes the MTJ structure to exhibit a switching current ratio that enables stable operation of the free layer, and wherein the switching current ratio includes a ratio of a first magnitude of a first switching current to a second magnitude of a second switching current, the first switching current to enable switching from the first state to the second state and the second switching current to enable switching from the second state to the first state.

17. The method of claim 16, wherein the data file has a GERBER format.

18. The method of claim 16, further comprising integrating the circuit board into a device selected from a set top box, a music player, a video player, an entertainment unit, a navigation device, a communications device, a personal digital assistant (PDA), a fixed location data unit, and a computer.

19. An apparatus comprising:

an access transistor; and a magnetic tunnel junction (MTJ) structure coupled to the access transistor, the MTJ structure including:

a free layer;

an antiferromagnetic layer; and a pinned layer positioned between the free layer and the antiferromagnetic layer, wherein a magnetic moment of the free layer is substantially parallel to a magnetic moment of the pinned layer in a first state and substantially antiparallel to the magnetic moment of the pinned layer in a second state, wherein the pinned layer has a physical dimension to produce an offset magnetic field that causes the MTJ structure to exhibit a switching current ratio that enables stable operation of the free layer.

20. The apparatus of claim 19, wherein the switching current ratio is based on a first switching current and a second switching current, the first switching current to switch the MTJ structure from the first state to the second state and the second switching current to switch the MTJ structure from the second state to the first state.

21. The apparatus of claim 20, wherein the switching current ratio includes a ratio of a first magnitude of the first switching current to a second magnitude of the second switching current, and wherein the physical dimension causes the first magnitude of the first switching current to be less than half of the second magnitude of the second switching current.

* * * * *